United States Patent
Yang

(10) Patent No.: US 8,823,601 B2
(45) Date of Patent: Sep. 2, 2014

(54) ANTENNA DEVICE FOR ELECTROMAGNETIC MEASUREMENT

(75) Inventor: Yong-Sheng Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 214 days.

(21) Appl. No.: 13/491,582

(22) Filed: Jun. 7, 2012

(65) Prior Publication Data

US 2013/0300630 A1    Nov. 14, 2013

(30) Foreign Application Priority Data

May 20, 2012  (CN) .......................... 2012 1 0143429

(51) Int. Cl.
*H01Q 1/08*    (2006.01)
(52) U.S. Cl.
USPC ............................. 343/880; 343/703; 343/891
(58) Field of Classification Search
CPC ........... H01Q 1/125; H01Q 1/32; H01Q 3/04; H01Q 3/32
USPC .................................. 343/703, 880, 882, 891
See application file for complete search history.

(56) References Cited

U.S. PATENT DOCUMENTS

| | | | |
|---|---|---|---|
| 2013/0284876 A1* | 10/2013 | Yang | 248/519 |
| 2013/0300630 A1* | 11/2013 | Yang | 343/880 |
| 2013/0313380 A1* | 11/2013 | Yang et al. | 248/123.2 |
| 2013/0335294 A1* | 12/2013 | He | 343/880 |
| 2014/0028523 A1* | 1/2014 | He | 343/882 |

* cited by examiner

*Primary Examiner* — Tan Ho
(74) *Attorney, Agent, or Firm* — Novak Druce Connolly Bove + Quigg LLP

(57) ABSTRACT

An antenna device includes a base, an adjusting pole perpendicularly extending up from the base, a slide apparatus slidably mounted to the adjusting pole, a supporting pole forming a rack and slidably installed in the slide apparatus along a direction perpendicular to a lengthwise of the adjusting pole, and an antenna mounted to one end of the supporting pole. The slide apparatus includes a casing and a motor installed in the casing. The casing defines two opposite guiding holes for the supporting pole extending through. The motor includes a driving roller meshing with the rack. The motor drives the driving roller to rotate and mesh with the rack to allow the antenna to move along the direction perpendicular to the slide direction of the slide apparatus.

6 Claims, 3 Drawing Sheets

ANTENNA DEVICE FOR ELECTROMAGNETIC MEASUREMENT

BACKGROUND

1. Technical Field

The present disclosure relates to an antenna device for electromagnetic measurement.

2. Description of Related Art

In electromagnetic measurement, such as electromagnetic interference (EMI) measurement, a test antenna may need to be fixed in an antenna holding device for measuring various kinds of information technology equipments (ITEs), such as personal computers, liquid crystal displays, or mobile phones. In measuring EMI, the test distance between the test antenna and each ITE is often fixed according to measurement specification. However, the volumes of the ITEs are different, so the antenna holding device needs to be moved relative to the ITEs to allow each test distance meets the measurement specification, which is time-consuming and inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
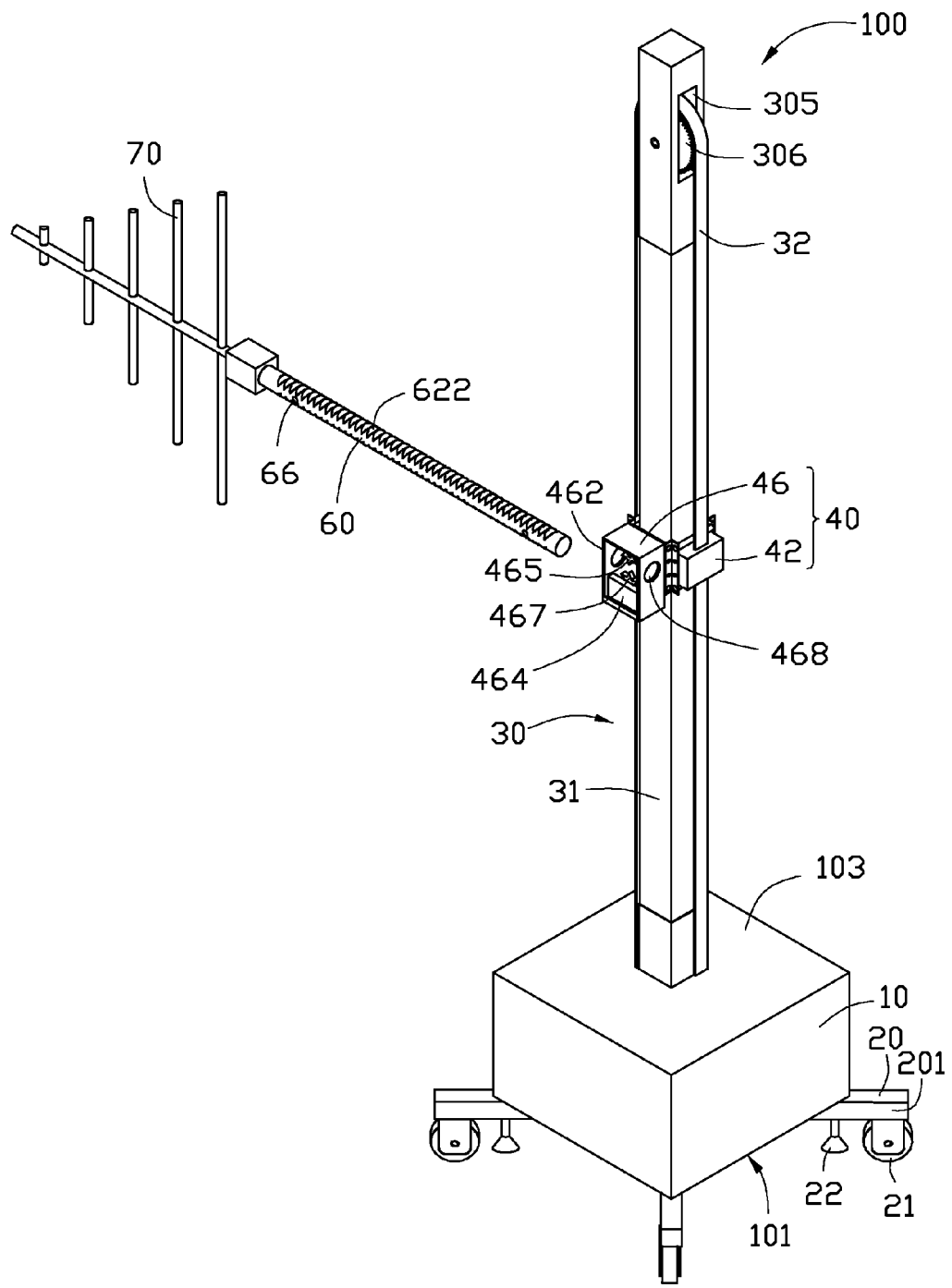
FIG. 1 is an exploded, isometric view of an exemplary embodiment of an antenna device.
Figure 2:
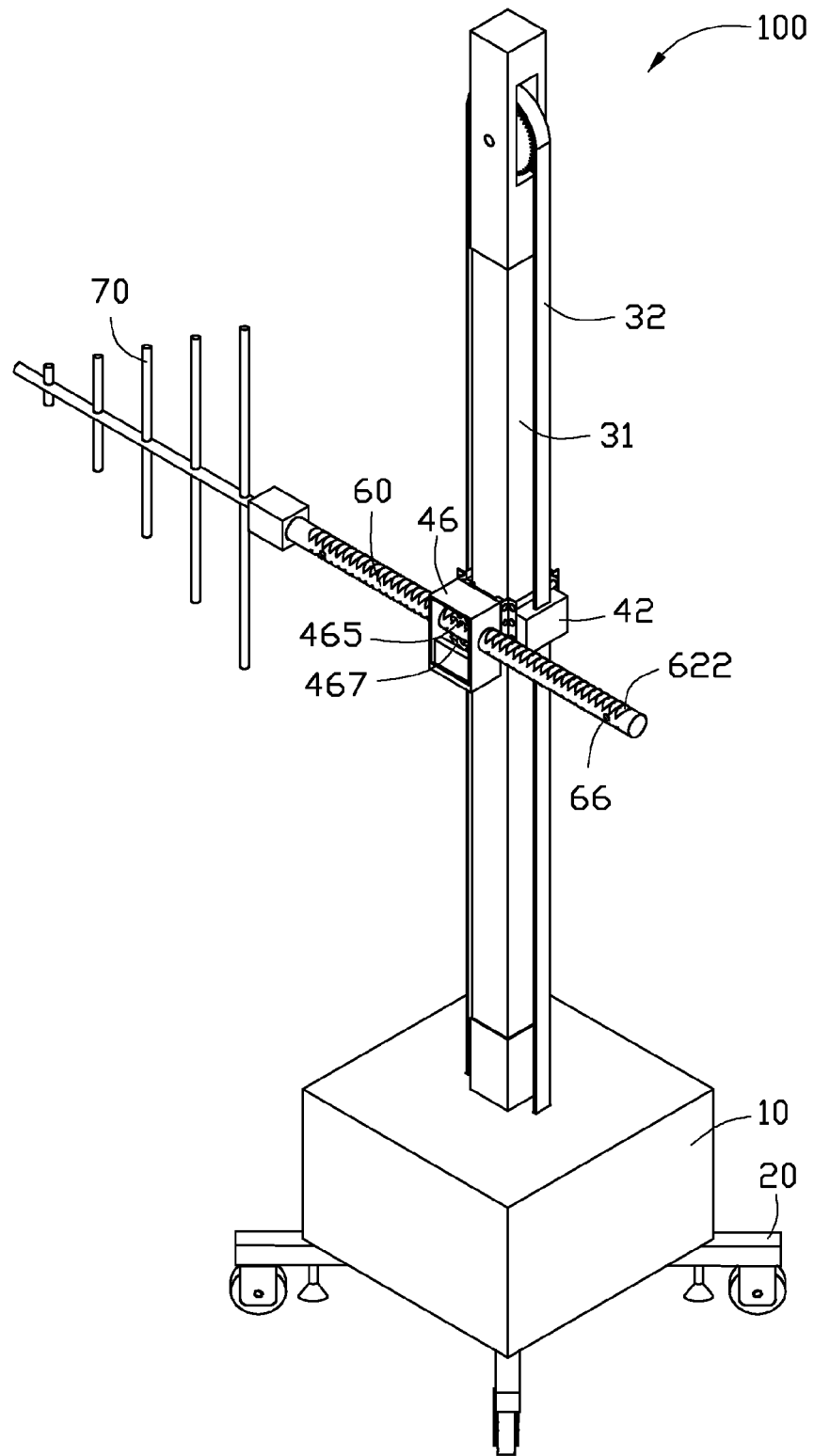
FIG. 2 is an assembled, isometric view of the antenna device of FIG. 1.

FIGS. 1 and 2, show an exemplary embodiment of an antenna device 100 which can be used to measure the intensity of electromagnetic radiations generated by an information technology equipment (ITE) 50 (shown in FIG. 3), such as a personal computer, a liquid crystal display, or a mobile telephone. The antenna device 100 includes a base 10, a holder 20, an adjusting pole 30, a slide apparatus 40, a supporting pole 60, and an antenna 70.

The base 10 is substantially rectangular, and includes a bottom surface 101 and a top surface 103. The holder 20 is substantially cross-shaped and mounted under the base 10. The holder 20 includes four beams 201 converged together, and four conveying wheels 21 and four support feet 22 which are respectively mounted on the undersides of the beams 201. In the embodiment, each beam 201 has one conveying wheel 21 and one support foot 22 correspondingly mounted on the underside of the beam 201. The four conveying wheels 21 are rotatably mounted on four distal ends of the beams 201. Thus the holder 20 and the base 10 can be horizontally moved due to rotation of the conveying wheels 21. Each support feet 22 is positioned adjacent to the corresponding conveying wheel 21 for retaining the holder 20 on predetermined locations.

The adjusting pole 30 includes a pole body 31 and a transmission belt 32. A bottom end of the pole body 31 is perpendicularly fixed on a center of the top surface 103. A longitudinal through hole 305 is defined in a top end of the pole body 31, extending through opposite side of the pole body 31. An adjusting wheel 306 is rotatably mounted in the through hole 305. The transmission belt 32 is coiled on the adjusting wheel 306 and is pulled to extend longitudinally along the pole body 31 by a motor (not shown) installed in the base 10. A rotation of the adjusting wheel 306 can drive the transmission belt 32 to move along the pole body 31.

The slide apparatus 40 includes two opposite slide blocks 42 slidably fitted about the pole body 31 and a positioning member 46 fixed to a side of the slide blocks 42. A part of the transmission belt 32 is attached in the slide blocks 42. In this way, movements of the transmission belt 32 along the pole body 31 can drive the slide apparatus 40 to slide along the pole body 31. The positioning member 46 includes a rectangular casing 462, a motor 464 fixed in the casing 462, and a positioning roller 465 longitudinally and rotatably mounted in the casing 462. The motor 464 includes a driving roller 467 parallel to the positioning roller 465. Two opposite sides of the casing 462 each define a guiding hole 468 between the driving roller 467 and the positioning roller 465, for allowing the supporting pole 60 to extend through.

The supporting pole 60 includes two opposite racks 622 defined in an outside surface of the supporting pole 60. Two infrared sensors 66 are installed on two opposite ends of the supporting pole 60. The supporting pole 60 is inserted into the guiding holes 468 of the slide apparatus 40. The racks 622 respectively mesh with the driving roller 467 and the positioning roller 465. The motor 464 drives the driving roller 467 to rotate, for moving the supporting pole 60 along the direction perpendicular to the lengthwise direction of the pole body 31, until one of the infrared sensors 66 moves to a corresponding one of the sides of the casing 462. Therefore, the supporting pole 60 can be moved along the adjusting pole 30 by the slide apparatus 40. The antenna 70 is mounted to one end of the supporting pole 60.

Figure 3:
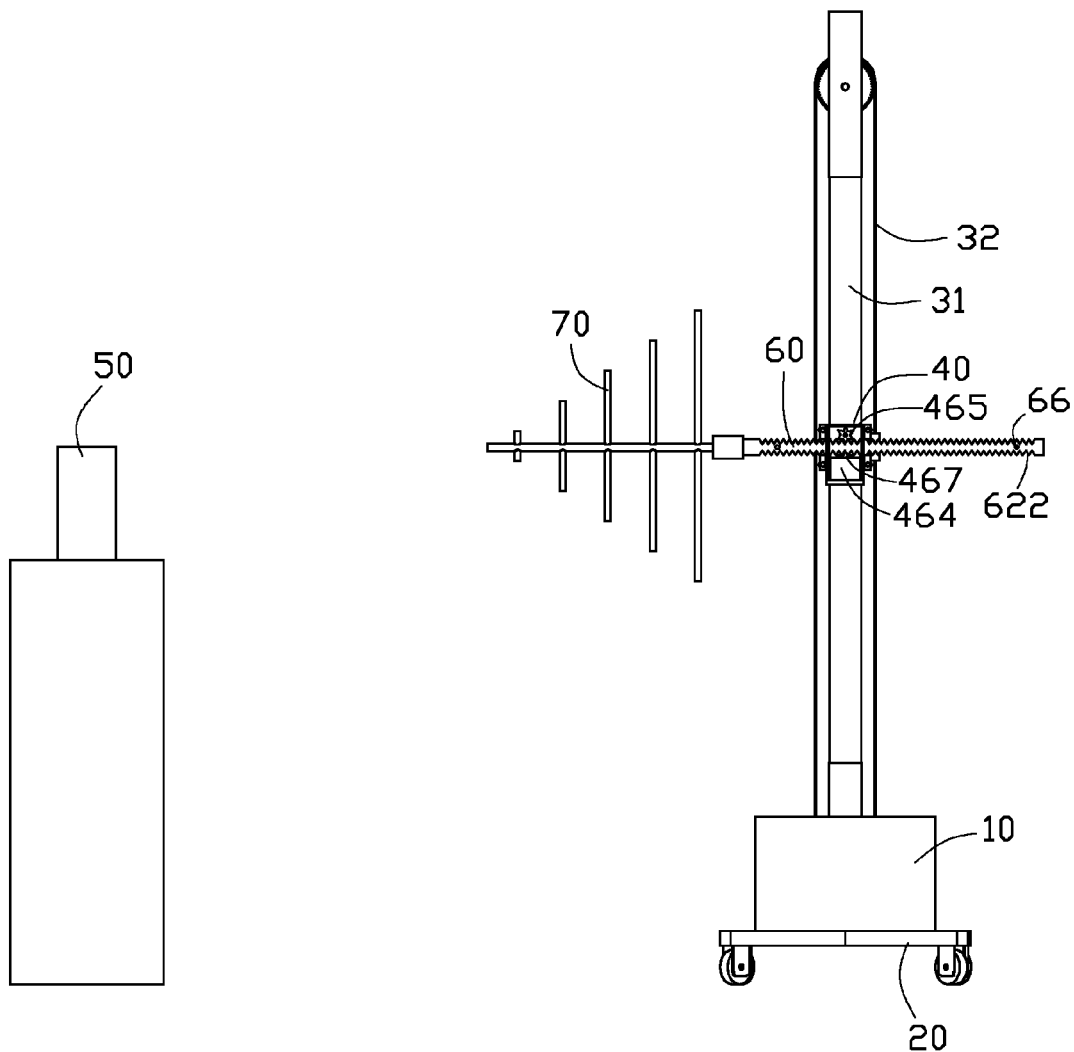
FIG. 3 is a side plan view of FIG. 2, showing the antenna device in use.

Referring to FIG. 3, in use, the antenna device 100 is placed on a selected electromagnetic measuring location. The adjusting wheel 306 is rotatably driven by the motor in the base 10, and drives the slide apparatus 40 to slide along the pole body 31 through the transmission belt 32. Therefore, the antenna 70 is adjusted to a predetermined height. The antenna device 100 is moved by rotating the conveying wheel 21 and positioned on a predetermined location by the support feet 22, thereby a distance between the antenna 70 and the ITE 50 can be adjusted to equal to the specification distance. Thus the antenna 70 can be used in electromagnetic measurement.

When testing another ITE 50, the motor 464 operates to rotate the driving roller 467 to move the supporting pole 60 along the guiding holes 468, without moving and repositioning the antenna device 100, until the distance between the antenna 70 and the another ITE 50 is equal to the specification distance for measuring the another ITE 50.

Even though numerous characteristics and advantages of the embodiments have been set forth in the foregoing description, together with details of the structure and function of the embodiments, the present disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. An antenna device, comprising:
   a base;
   an adjusting pole extending up from the base;
   a slide apparatus mounted to the adjusting pole and slidable along a lengthwise direction of the adjusting pole;
   a supporting pole longitudinally forming a first rack and slidably installed to the slide apparatus along a direction perpendicular to the lengthwise of the adjusting pole; and
   an antenna mounted to one end of the supporting pole, wherein the slide apparatus comprises a casing and a motor installed in the casing, opposite sides of the casing defines two guiding holes through which the supporting pole extends, the motor comprises a driving roller meshing with the first rack, the motor drives the driving roller to rotate and mesh with the first rack to allow the antenna to move along the direction perpendicular to the slide direction of the slide apparatus.

2. The antenna device of claim 1, wherein the adjusting pole comprises a pole body and a transmission belt, a bottom end of the pole body is fixed on a top surface of the base, a longitudinal through hole is defined in a top end of the pole body, an adjusting wheel is rotatably received in the through hole, the transmission belt is coiled on the adjusting wheel and is pulled to extend longitudinally along the pole body, the slide apparatus is slidably fitted about the pole body and fixed to the transmission belt.

3. The antenna device of claim 2, wherein the slide apparatus further comprises two opposite slide blocks slidably fitted about the pole body, the casing is fixed to a side of the slide blocks, a positioning roller is rotatably mounted in the casing, the supporting pole defines a second rack opposite to the first rack to mesh with the positioning roller.

4. The antenna device of claim 1, wherein two infrared sensors are installed on two opposite ends of the supporting pole, the supporting pole can be slid, until one of the infrared sensors moves to a corresponding one of the sides of the casing.

5. The antenna device of claim 1, wherein a cross-shaped holder is mounted under the base, the holder comprises four beams converged together, and four conveying wheels respectively mounted on undersides of the beams.

6. The antenna device of claim 5, wherein a support foot is mounted on the underside of each beam adjacent to the corresponding conveying wheel.

* * * * *